(12) United States Patent
Liao et al.

(10) Patent No.: US 12,035,474 B2
(45) Date of Patent: Jul. 9, 2024

(54) METHOD AND SYSTEM FOR STACKING PRINTED CIRCUIT BOARD

(71) Applicant: Chiun Mai Communication Systems, Inc., New Taipei (TW)

(72) Inventors: Chi-Yi Liao, New Taipei (TW); Yen-Chung Huang, New Taipei (TW); Wen-Yu Wang, Shenzhen (CN)

(73) Assignee: Chiun Mai Communication Systems, Inc., New Taipei (TW)

( * ) Notice: Subject to any disclaimer, the term of this patent is extended or adjusted under 35 U.S.C. 154(b) by 401 days.

(21) Appl. No.: 17/544,766

(22) Filed: Dec. 7, 2021

(65) Prior Publication Data

US 2023/0097863 A1 Mar. 30, 2023

(30) Foreign Application Priority Data

Sep. 24, 2021 (CN) ............................ 202111122404.4

(51) Int. Cl.
*H05K 1/14* (2006.01)
*B23K 1/00* (2006.01)
*H05K 3/36* (2006.01)

(52) U.S. Cl.
CPC ........... *H05K 1/144* (2013.01); *B23K 1/0016* (2013.01); *H05K 3/368* (2013.01)

(58) Field of Classification Search
CPC ....... B23K 1/0016; H05K 1/144; H05K 3/368
See application file for complete search history.

(56) References Cited

U.S. PATENT DOCUMENTS

| 3,205,469 A * | 9/1965 | Frank | H05K 3/308 361/784 |
| 4,125,309 A * | 11/1978 | Grantiz | H02B 1/207 439/48 |
| 4,778,393 A * | 10/1988 | Hosogai | H02B 1/207 439/45 |
| 2003/0232522 A1* | 12/2003 | Buondelmonte | H05K 3/368 439/74 |
| 2006/0035412 A1* | 2/2006 | Popescu | H01L 24/40 257/772 |

(Continued)

FOREIGN PATENT DOCUMENTS

| CN | 103681365 B | 8/2016 |
| CN | 108834332 A | 11/2018 |

(Continued)

*Primary Examiner* — Nathan Milakovich
(74) *Attorney, Agent, or Firm* — ScienBiziP, P.C.

(57) ABSTRACT

A method and a system for stacking printed circuit boards includes providing a lower baseboard, a pinboard, and an upper baseboard; printing a first solder paste on the lower baseboard; placing a placement component on the lower baseboard; placing the pinboard on the lower baseboard; reflow soldering the lower baseboard with the placement component and the pinboard and forming a first assembly; printing the first solder paste and a second solder paste on the upper baseboard; placing the placement component on the upper baseboard and the first assembly on the upper baseboard; and reflow soldering the upper baseboard with the placement component and the first assembly and forming a printed circuit board; a melting point of the first solder paste is higher than a melting point of the second solder paste.

16 Claims, 8 Drawing Sheets

(56) References Cited

U.S. PATENT DOCUMENTS

2020/0367367 A1  11/2020 Samsudin et al.
2021/0249335 A1* 8/2021 Krutsch .............. H01L 23/3735
2021/0315107 A1* 10/2021 Vasudevan ........... B23K 1/0016

FOREIGN PATENT DOCUMENTS

CN    109618506 A   4/2019
TW    200906254 A   2/2009

* cited by examiner

METHOD AND SYSTEM FOR STACKING PRINTED CIRCUIT BOARD

CROSS-REFERENCE TO RELATED APPLICATIONS

This application claims priority to Chinese Patent Application No. 202111122404.4 filed on Sep. 24, 2021, the contents of which are incorporated by reference herein.

FIELD

The subject matter herein generally relates to semiconductor assembling technology, and particularly to a method and a system for stacking printed circuit board.

BACKGROUND

Nowadays, stacking of printed circuit board (PCB), such as a three-layer PCB, requires independent processes for solder paste printing and reflow soldering on an upper board and a pinboard, then assembling the upper board and the pinboard to a lower board for further reflow soldering. However, during the entire stacking process, several assembly lines with surface mounted technology (SMT) and many assembly machines are needed, and the entire stacking process is complicated.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
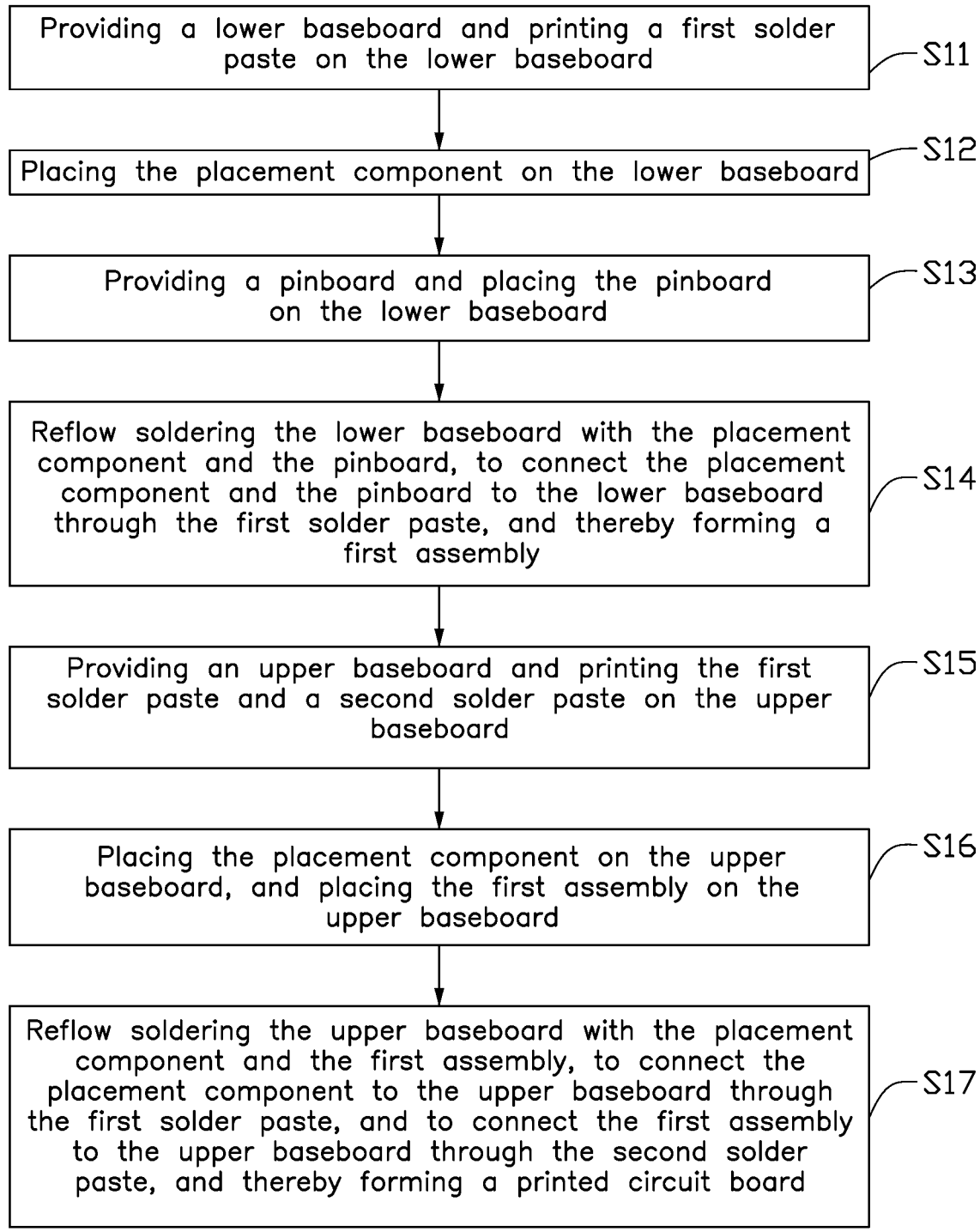
FIG. 1 illustrates a flowchart of an embodiment of a method for stacking printed circuit board.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The present disclosure, including the accompanying drawings, is illustrated by way of examples and not by way of limitation. Several definitions that apply throughout this disclosure will now be presented. It should be noted that references to "an" or "one" embodiment in this disclosure are not necessarily to the same embodiment, and such references mean "at least one."

Furthermore, the term "module", as used herein, refers to logic embodied in hardware or firmware, or to a collection of software instructions, written in a programming language, such as Java, C, or assembly. One or more software instructions in the modules can be embedded in firmware, such as in an EPROM. The modules described herein can be implemented as either software and/or hardware modules and can be stored in any type of non-transitory computer-readable medium or another storage device. Some non-limiting examples of non-transitory computer-readable media include CDs, DVDs, BLU-RAY, flash memory, and hard disk drives. The term "comprising" means "including, but not necessarily limited to"; it in detail indicates open-ended inclusion or membership in a so-described combination, group, series, and the like.

FIGS. 1 and 2 illustrate at least one embodiment of a method for stacking printed circuit board.

The method is provided by way of example, as there are a variety of ways to carry out the method. Each block shown in FIG. 1 represents one or more processes, methods, or subroutines carried out in the example method. Furthermore, the illustrated order of blocks is by example only and the order of the blocks can be changed. Additional blocks may be added or fewer blocks may be utilized, without departing from this disclosure. The example method can begin at block S11.

At block S11, providing a lower baseboard 100 and printing a first solder paste 410 on the lower baseboard 100.

Figure 2A:
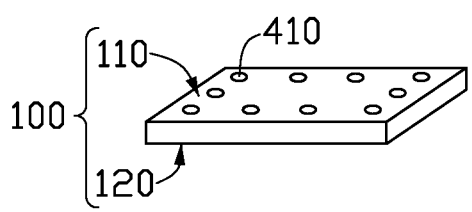
FIGS. 2A-2H are schematic views of an embodiment of the method of FIG. 1.

Referring to FIG. 2A, in at least one embodiment, the lower baseboard 100 includes a lower first surface 110 and a lower second surface 120. The lower first surface 110 provides a first bonding pad (not shown) and a second bonding pad (not shown). The first bonding pad is configured to connect a placement component 500 (shown in FIG. 2B), the second bonding pad is configured to connect a pinboard 200 (shown in FIG. 2C). The first solder paste 410 may be printed on the first bonding pad and the second bonding pad on the lower first surface 110. In at least one embodiment, the placement component 500 may be a surface mount technology (SMT) component or a component applied in the SMT. The pinboard 200 may be but is not limited to an interposer board.

In other embodiments, the lower second surface 120 may provide the first bonding pad. The first solder paste 410 may be printed on the first bonding pad on the lower second surface 120.

In at least one embodiment, the second bonding pad (in position to connect to the pinboard 200) may be on the lower first surface 110 or the lower second surface 120. The second bonding pad may be arranged on the lower second surface 120.

In at least one embodiment, the first solder paste 410 may be printed on the lower baseboard 100 through a solder paste printer (not shown).

At block S12, placing the placement component 500 on the lower baseboard 100.

Figure 2B:
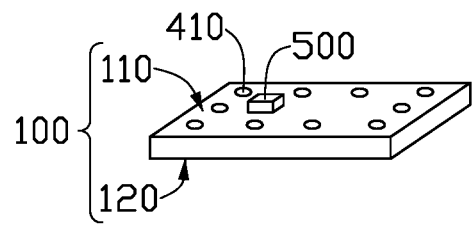

As shown in FIG. 2B, in at least one embodiment, the placement component 500 is placed on a first bonding pad (not shown) of a surface (such as the lower first surface 110 shown in FIG. 2B) of the lower baseboard 100.

In some other embodiments, the placement component 500 may be placed only on the first bonding pad of the lower second surface 120. In other embodiments, the placement component 500 may be placed on the first bonding pad of the lower first surface 110 and the first bonding pad of the lower second surface 120.

In at least one embodiment, the placement component 500 may be placed on the lower baseboard 100 through a pick and place machine (not shown).

At block S13, providing a pinboard 200 and placing the pinboard 200 on the lower baseboard 100.

Figure 2C:
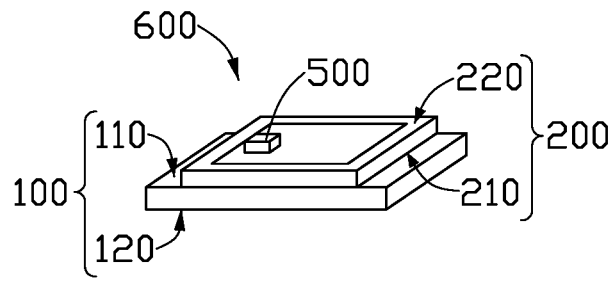

As shown in FIG. 2C, in at least one embodiment, the pinboard 200 includes a pinboard first surface 210 and a pinboard second surface 220. The pinboard first surface 210 and the pinboard second surface 220 both include a second bonding pad (not shown). The second bonding pad of the pinboard first surface 210 corresponds to the second bonding pad of the pinboard second surface 220.

When the pinboard 200 is placed on the lower baseboard 100, the second bonding pad of the pinboard first surface 210 will contact the first solder paste 410 on the lower first surface 110, thus the pinboard 200 is connected to the lower baseboard 100 through the first solder paste 410.

In at least one embodiment, the pinboard 200 is placed on the lower baseboard 100 through a pick and place machine (not shown).

In at least one embodiment, the pick and place machine in block S12 and in block S13 may be same or different pick and place machine. For instance, in block S12, a pick and place machine configured to mount components (such as resistors, capacitors, and inductors) with small sizes can be used. In block S13, a pick and place machine configured to mount components (such as the pinboard 200 or integrated circuits) with larger sizes can be used.

At block S14, reflow soldering the lower baseboard 100 with the placement component 500 and the pinboard 200, to connect the placement component 500 and the pinboard 200 to the lower baseboard 100 through the first solder paste 410, and thereby forming a first assembly 600.

As shown in FIG. 2C, in at least one embodiment, the lower baseboard 100 is placed with the placement component 500 and the pinboard 200. Reflow soldering the lower baseboard 100 with a high temperature (reaching at least melting point of the first solder paste 410) through a reflow soldering machine (not shown), the first solder paste 410 (not shown) melting and upon cooling, the lower baseboard 100, the placement component 500, and the pinboard 200 are formed as one, that is the first assembly 600.

In at least one embodiment, the reflow soldering may be performed by a reflow soldering machine (not shown). A soldering temperature of the reflow soldering machine may be preset according to the melting point of the first solder paste 410. For instance, in at least one embodiment, the melting point of the first solder paste 410 may be 220° C., thus, the soldering temperature of the reflow soldering machine may be preset to at least 220° C.

At block S15, providing an upper baseboard 300 and printing the first solder paste 410 and a second solder paste 420 on the upper baseboard 300.

Figure 3:
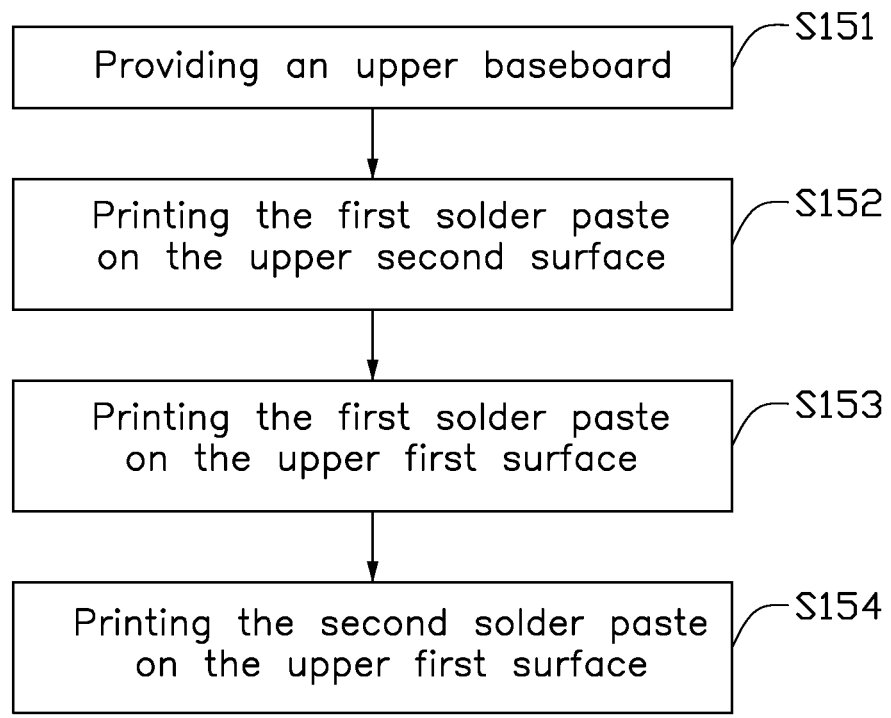
FIG. 3 illustrates a flowchart of an embodiment of a block S15 of the method of FIG. 1.

FIG. 3 illustrates a flowchart of an embodiment of block S15, block S15 may further include:

At block S151, providing an upper baseboard 300. The upper baseboard 300 includes an upper first surface 310 and an upper second surface 320.

In at least one embodiment, the upper first surface 310 may include a first bonding pad (not shown) and a second bonding pad (not shown). The upper second surface 320 includes the first bonding pad.

At block S152, printing the first solder paste 410 on the upper second surface 320.

Figure 2D:
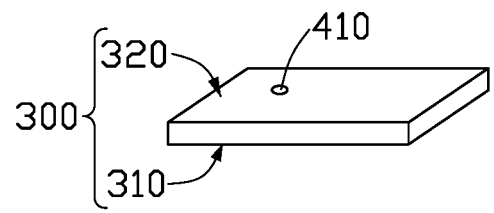

As shown in FIG. 2D, in at least one embodiment, the first solder paste 410 may be printed on the first bonding pad (not shown) of the upper second surface 320.

If the upper second surface 320 does not have the placement component 500, block S152 may be omitted, that is, block S153 may be performed after block S151.

At block S153, printing the first solder paste 410 on the upper first surface 310.

Figure 2E:
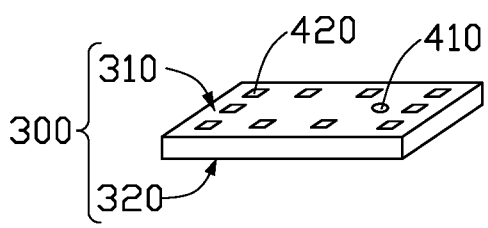

As shown in FIG. 2E, in at least one embodiment, the first solder paste 410 may be printed on the first bonding pad (not shown) of the upper first surface 310.

At block S154, printing the second solder paste 420 on the upper first surface 310.

As shown in FIG. 2E, in at least one embodiment, the second solder paste 420 may be printed on the second bonding pad (not shown) of the upper first surface 310.

In at least one embodiment, blocks S152-S154 may be performed by a solder paste printer (not shown).

In at least one embodiment, block S154 may further include arranging a second frame 820 on the upper first surface 310; and printing the second solder paste 420 on the upper first surface 310.

In other embodiments, when printing the solder paste (including the first solder paste 410 referring to block S153 and the second solder paste 420 referring to block S154), the method further includes arranging the frame. For instance, referring to FIG. 3, block S153 includes:

Arranging a first frame 810 on the upper first surface 310.

Printing the first solder paste 410 on the upper first surface 310.

As shown in FIGS. 4A, 4B, 5A, and 5B, in at least one embodiment, the frame includes the first frame 810 and the second frame 820. The first frame 810 and the second frame 820 may be but are not limited to stencils.

Figure 4A:
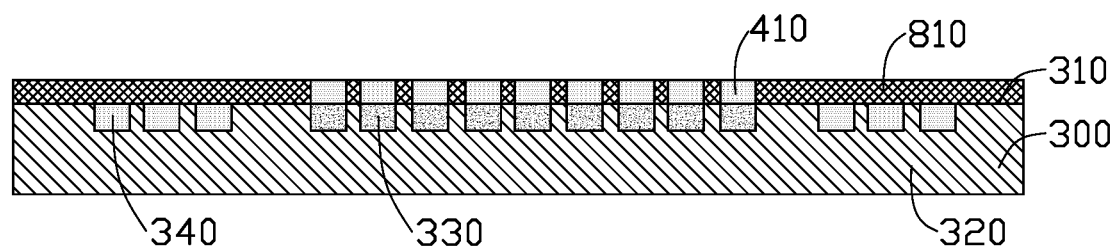
FIGS. 4A-4B are schematic views of an embodiment showing an engagement of a first frame and an upper baseboard.
Figure 4B:
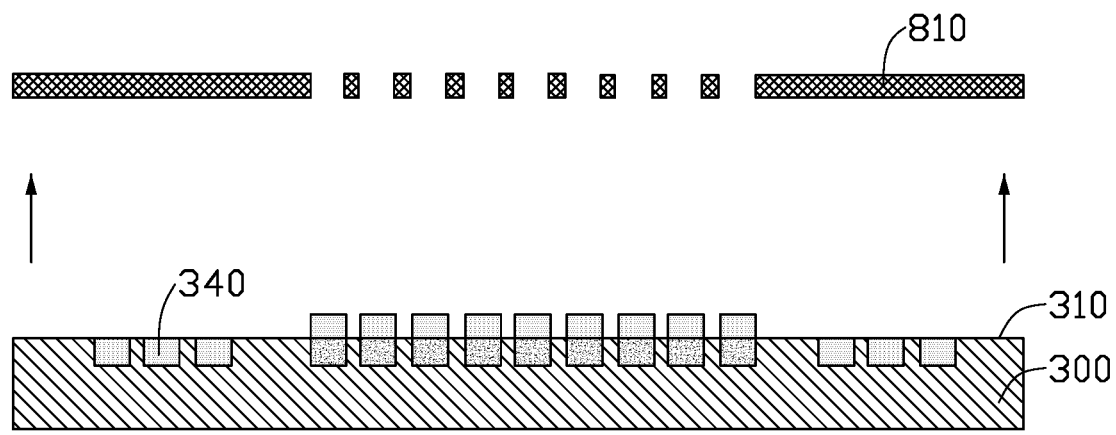

As shown in FIGS. 4A and 4B, when printing the first solder paste 410, arrange the first frame 810. Openings of the first frame 810 are to correspond to first bonding pads 330 of the upper first surface 310, parts of the first frame 810 corresponding to second bonding pads 340 are closed. Thus, after placing the first solder paste 410 on the first frame 810, and scraping away solder by a scraper (not shown), the first solder paste 410 may be printed on the first bonding pads 330.

Figure 5A:
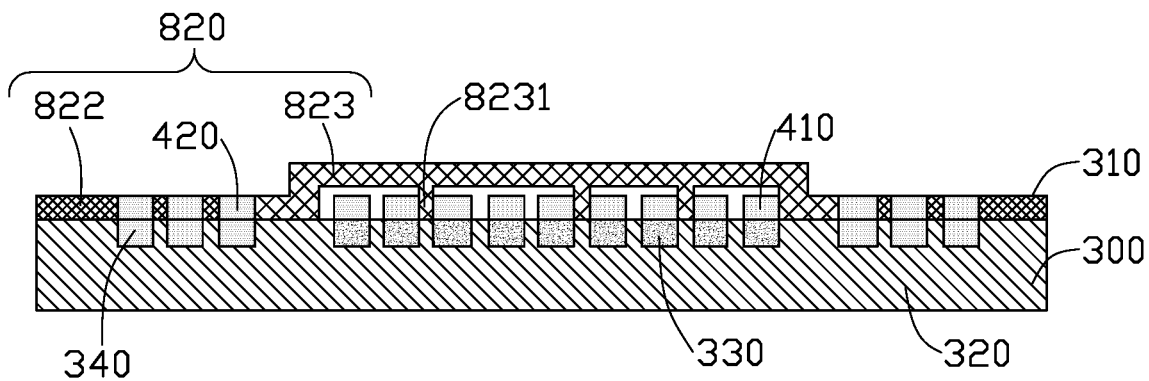
FIGS. 5A-5B are schematic views of an embodiment showing an engagement of a second frame and the upper baseboard.
Figure 5B:
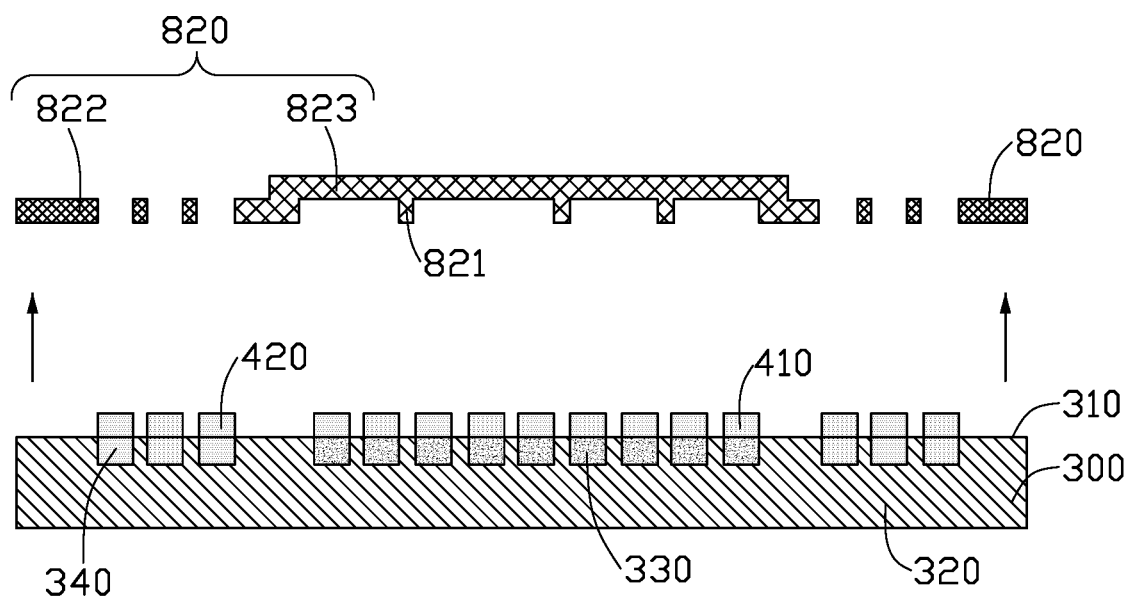

As shown in FIGS. 5A and 5B, when printing the second solder paste 420, arrange the second frame 820. Openings of the second frame 820 correspond to second bonding pads 340 of the upper first surface 310, parts of the second frame 820 corresponding to first bonding pads 330 are closed. Thus, after placing the second solder paste 420 on the second frame 820, and scraping solder away by a scraper (not shown), the second solder paste 420 may be printed on the second bonding pads 340.

When printing the second solder paste 420, there are printed first solder paste 410 on the upper first surface 310, thus the second frame 820 may be a step steel frame. The second frame 820 includes a print portion 822 and a shelter portion 823. The print portion 822 and the shelter portion 823 may be step in shape. The shelter portion 823 is configured to shelter the printed first solder paste 410 when printing the second solder paste 420. Positions of the print portion 822 and the shelter portion 823 are not limited to those shown, but may be adjusted according to positions and sizes of the first solder paste 410 and the second solder paste 420.

In at least one embodiment, the shelter portion 823 may include a supporter 8231 configured to resist against the upper first surface 310, and located between two adjacent first bonding pads 330 (or two adjacent first solder pastes 410). The supporter 8231 prevents the shelter portion 823 being pressed into or onto the printed first solder paste 410 when the scraper is employed to scrape solder away.

Figure 6A:
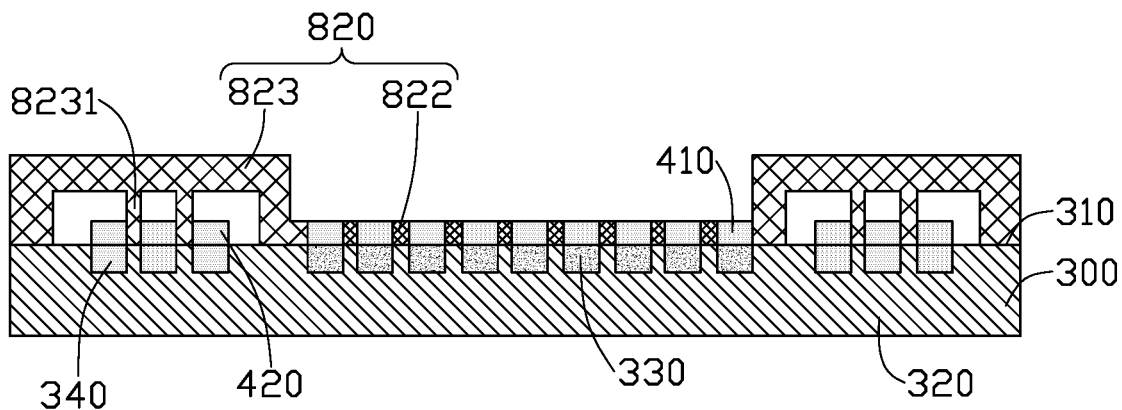
FIGS. 6A-6B are other schematic views of an embodiment showing the engagement of the second frame and the upper baseboard.
Figure 6B:
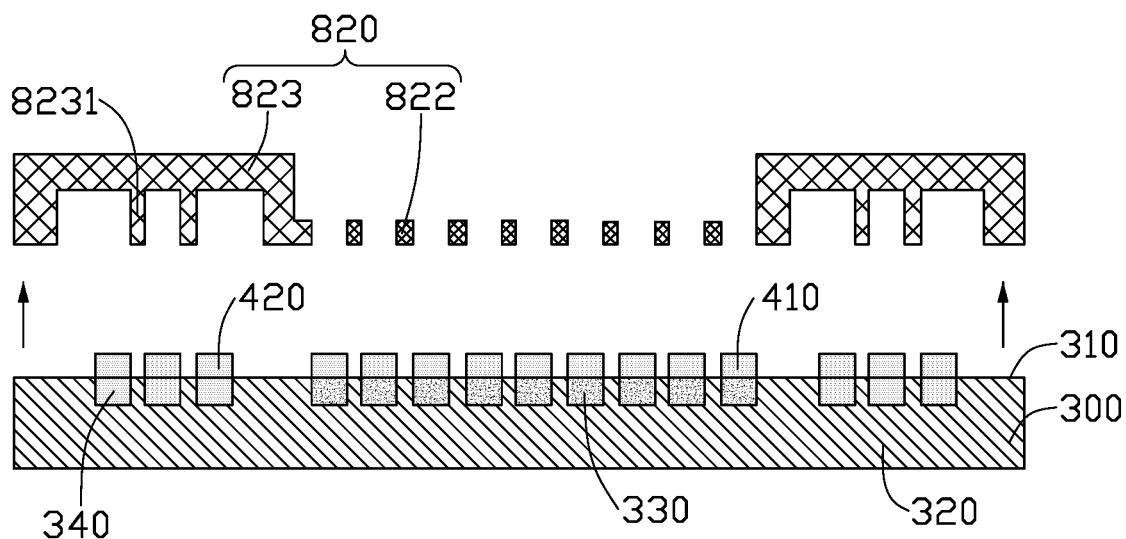

Similarly, as shown in FIGS. 6A and 6B, the second frame 820 includes a print portion 822 and a shelter portion 823. The shelter portion 823 is configured to shelter the printed second solder paste 420 when printing the first solder paste 410. Similarly, the shelter portion 823 may include a supporter 8231, which is similar to that described in FIGS. 5A and 5B.

A sequence of blocks S152-S154 may be adjusted. For instance, in at least one embodiment, a sequence of blocks S153 and S154 may be exchanged. That is, printing the second solder pastes 420 prior to printing the first solder pastes 410. Then, openings of the first frame 810 would correspond to the second bonding pads 340 of the upper first surface 310, parts of the second frame 820 corresponding to first bonding pads 330 being closed. A structure of second frame 820 might also be changed accordingly.

Additionally, block S152 may apply after blocks S153 and S154, that is, printing the first solder pastes 410 and the second solder pastes 420 on the upper first surface 310 prior to printing the first solder pastes 410 on the upper second surface 320.

Different melting points are found in the first solder pastes 410 and the second solder pastes 420. In at least one embodiment, a melting point of the first solder paste 410 is 220° C., a melting point of the second solder paste 420 is 190° C.

Referring to FIG. 1, at block S16, placing the placement component 500 on the upper baseboard 300, and placing the first assembly 600 on the upper baseboard 300.

Figure 2F:
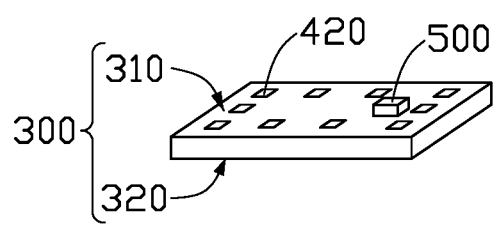

As shown in FIG. 2F, in at least one embodiment, placing the first bonding pad (not shown) of the placement component 500 on a surface (such as the upper first surface 310 as shown in FIG. 2F) of the upper baseboard 300.

In some other embodiments, the placement component 500 may be placed only on the first bonding pad of the upper second surface 320. In other embodiments, the placement component 500 may be placed on the first bonding pad of the upper first surface 310 and the first bonding pad of the upper second surface 320.

Figure 2G:
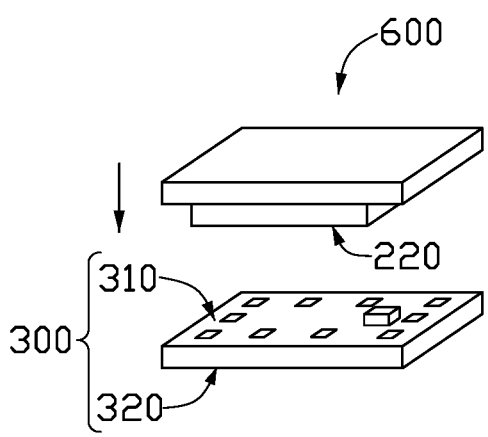

As shown in FIG. 2G in at least one embodiment, placing the first assembly 600 on the upper first surface 310. The second bonding pad (not shown) of the pinboard second surface 220 contacts the second solder paste 420 on the upper first surface 310, thus the pinboard 200 is connected to the upper baseboard 100 through the second solder paste 420.

A sequence of placing the placement component 500 and the first assembly 600 is not limited to that described. In other embodiments, the first assembly 600 is placed prior to placement of the placement component 500.

In at least one embodiment, the placing of the placement component 500 and the first assembly 600 is done by a pick and place machine (not shown). A pick and place machine for placing the placement component 500 and a pick and place machine for placing the first assembly 600 may be same or different.

Referring to FIG. 1, at block S17, reflow soldering the upper baseboard 300 with the placement component 500 and the first assembly 600, to connect the placement component 500 to the upper baseboard 300 through the first solder paste 410, and to connect the first assembly 600 to the upper baseboard 300 through the second solder paste 420, and thereby forming a printed circuit board 700.

Figure 2H:
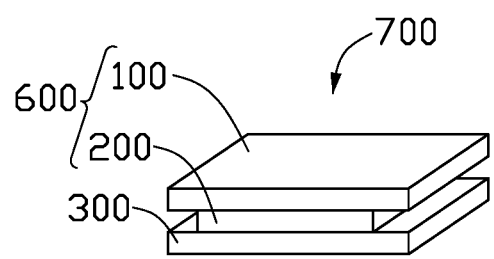

As shown in FIGS. 2G 2H, in at least one embodiment, the upper baseboard 300 with the placement component 500 and the first assembly 600 is placed in reflow soldering machine (not shown) with a high temperature for reflow soldering (at least reaching a melting point of the first solder paste 410), the first solder paste 410 (as shown in FIG. 2E) and the second solder paste 420 melt and then after cooling, the upper baseboard 300, the placement component 500, and the first assembly 600 are formed as one, that is the printed circuit board 700.

In at least one embodiment, the reflow soldering may be performed by a reflow soldering machine (not shown). A soldering temperature of the reflow soldering machine used in block S17 may be preset according to the respective melting points of the first solder paste 410 and the second solder paste 420. For instance, in at least one embodiment, obtaining a higher temperature by comparing the melting points of the first solder paste 410 and the second solder paste 420, thus the soldering temperature of the reflow soldering machine may be preset to a level at least greater than the higher temperature.

Using a single reflow soldering machine (that is, using a same soldering temperature) for the first solder paste 410 and the second solder paste 420, and presetting the soldering temperature for melting the first solder paste 410 with a higher melting point, thereby melting the first solder paste 410 and the second solder paste 420, reduces a usage of the reflow soldering machine.

Since the first solder paste 410 and the second solder paste 420 have different melting points, maintenance of the printed circuit board 700 requires only the adjustment of the temperature of a heat gun to the melting point of the second solder paste 420, so as to melt the second solder paste 420 between the first assembly 600 and the upper baseboard 300, for disassembly. Thus, maintenance process for the printed circuit board 700 is faster and simpler.

Figure 7:
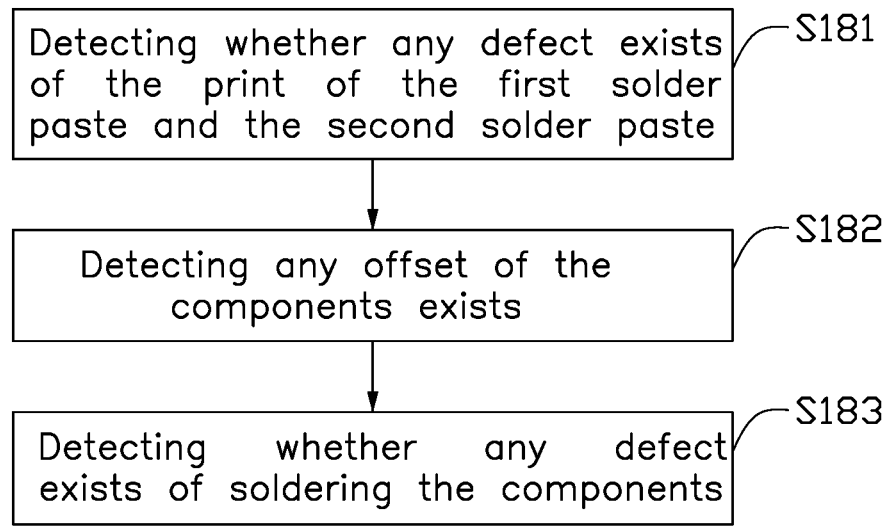
FIG. 7 illustrates a flowchart of another embodiment of a method for stacking printed circuit board.

Referring to FIGS. 1 and 7, after printing the first solder paste 410 on the lower baseboard 100, and printing the first solder paste 410 and the second solder paste 420 on the upper baseboard 300, the method for the printed circuit board further includes:

At block S181, detecting whether any defect exists of the print of the first solder paste 410 and the second solder paste 420.

For instance, after block S11, detecting whether a thickness and a size of the print of the first solder paste 410 meets a predetermined standard. Similarly, after block S15, detecting whether the print of the first solder paste 410 and the second solder paste 420 meets the predetermined standard.

In at least one embodiment, block S181 may be performed by inspecting the solder paste (solder paste inspection, (SPI)).

After placing the placement component 500, the pinboard 200, or the first assembly 600, the method for stacking printed circuit board further includes:

At block S182, detecting any offset of the components exists. Such components may be the placement component 500, the pinboard 200, and the first assembly 600.

In at least one embodiment, an automated optical inspection (AOI) may be used for detecting the positions of the components.

In at least one embodiment, after placing the placement component 500 on the lower baseboard 100 or the upper baseboard 300 (that is after blocks S12 or S16), detecting a placement of the placement component 500. After placing the pinboard 200 on the lower first surface 110 (that is after block S13), detecting placement of the pinboard 200. After placing the first assembly 600 on the upper first surface 310 (that is after block S16), detecting placement of the first assembly 600.

After reflow soldering, the method for stacking printed circuit board further includes:

At block S183, detecting whether any defect exists of soldering the components. Such components may be the placement component 500, the pinboard 200, and the first assembly 600.

In at least one embodiment, an automated optical inspection (AOI) may be used for detecting whether any defect exists in the soldering of the components.

In at least one embodiment, after reflow soldering of the lower baseboard 100 or the upper baseboard 300 with the placement component 500 (that is after blocks S14 or S17), detecting whether any defect exists in the soldering of the placement component 500. After reflow soldering the lower baseboard 100 with the pinboard 200 (that is after block S14), detecting whether any defect exists in the soldering of the pinboard 200. After reflow soldering the upper baseboard 300 with the first assembly 600 (that is after block S17), detecting any defect in the soldering of the first assembly 600.

By placing the pinboard 200 on the lower baseboard 100 as a component and reflow soldering the same to form the first assembly 600, and placing the first assembly 600 on the upper baseboard 300 as a component and reflow soldering the same, SMT lines used in the assembling process are decreased, thereby simplifying the assembling process and reducing the usage of the machine.

Figure 8:
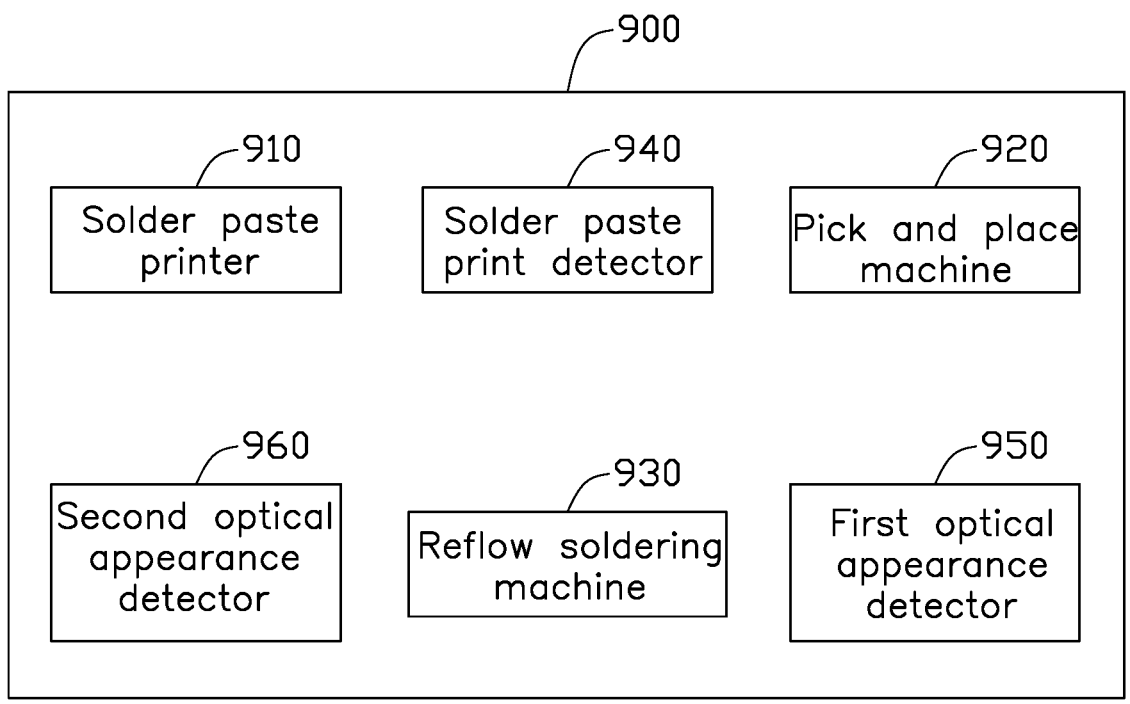
FIG. 8 is a block view of an embodiment of a system for stacking printed circuit board.

FIG. 8 illustrates at least one embodiment of a system 900 for creating stacked printed circuit board. The system 900 includes a solder paste printer 910, a pick and place machine 920, a reflow soldering machine 930, a solder paste print detector 940, a first optical appearance detector 950, and a second optical appearance detector 960.

The solder paste printer 910 is configured to print solder paste, as in blocks S11 and S15. The solder paste may be the first solder paste 410 and the second solder paste 420 as shown in FIG. 2E.

The pick and place machine 920 is configured to place components, as in blocks S12, S13, and S16. The components may be the placement component 500, the pinboard 200, and the first assembly 600 as shown in FIG. 2C.

The reflow soldering machine 930 is configured to reflow soldering, such as to perform blocks S14 and S17 of the method.

The solder paste print detector 940 is configured to detect whether any defect exists of the solder paste, as in block S181.

The first optical appearance detector 950 is configured to detect the placements of the placement component 500, the pinboard 200, and the first assembly 600, as in block S182.

The second optical appearance detector 960 is configured to detect whether any defect exists of the soldering of the placement component 500, the pinboard 200, and the first assembly 600, as in block S183.

In at least one embodiment, the numbers of solder paste printers 910, the pick and place machines 920, the reflow soldering machines 930, the solder paste print detectors 940, the first optical appearance detectors 950, and the second optical appearance detectors 960 may be one or more. A plurality of production lines of the method for stacking printed circuit board may be arranged for improving a production efficiency. In one embodiment, the system for stacking printed circuit board may include two production lines for sequentially performing the processes of the lower baseboard 100 and the upper baseboard 300. In each production line, a plurality of the machines shown in FIG. 8 may be arranged. The two production lines may cooperatively perform the method for stacking printed circuit board.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being embodiments of the present disclosure.

What is claimed is:

1. A method for stacking printed circuit boards comprising:

providing a lower baseboard and printing a first solder paste on the lower baseboard;

placing a placement component on the lower baseboard;

providing a pinboard and placing the pinboard on the lower baseboard;

reflow soldering the lower baseboard with the placement component and the pinboard, to connect the placement component and the pinboard to the lower baseboard through the first solder paste, and thereby forming a first assembly;

providing an upper baseboard and printing the first solder paste and a second solder paste on the upper baseboard;

placing the placement component on the upper baseboard, and placing the first assembly on the upper baseboard; and reflow soldering the upper baseboard with the placement component and the first assembly, to connect the placement component to the upper baseboard through the first solder paste, and to connect the first assembly to the upper baseboard through the second solder paste, and thereby forming a printed circuit board;

wherein a melting point of the first solder paste is higher than a melting point of the second solder paste.

2. The method according to claim 1, wherein the providing an upper baseboard and printing the first solder paste and a second solder paste on the upper baseboard comprises:

providing the upper baseboard, the upper baseboard comprises an upper first surface and an upper second surface opposite to the upper first surface;

printing the first solder paste on the upper baseboard; and printing the second solder paste on the upper first surface.

3. The method according to claim 2, wherein the printing the first solder paste on the upper baseboard comprises:

printing the first solder paste on the upper second surface; and printing the first solder paste on the upper first surface.

4. The method according to claim 3, wherein the printing the first solder paste on the upper first surface further comprises:
arranging a first frame on the upper first surface; and printing the first solder paste on the upper first surface;
wherein the printing the second solder paste on the upper first surface further comprises: arranging a second frame on the upper first surface; and printing the second solder paste on the upper first surface; wherein the second frame is a stepped-shaped steel frame and configured to shelter the first solder paste.

5. The method according to claim 4, wherein the second frame comprises a print portion and a shelter portion, the print portion and the shelter portion form a stepped-shape, and the shelter portion is configured to shelter the printed first solder paste when printing the second solder paste.

6. The method according to claim 5, wherein the shelter portion comprises a supporter configured to resist against the upper baseboard.

7. The method according to claim 1, further comprising:
after printing the solder paste on the upper baseboard and the lower baseboard, detecting whether any defect exists of the printing of the solder paste; wherein the solder paste comprises the first solder paste and the second solder paste;
after placing the placement component on the upper baseboard and the lower baseboard, detecting placing positions of the placement component;
after placing the pinboard on the lower baseboard, detecting a placing position of the pinboard; and
after placing the first assembly on the upper baseboard, detecting a placing position of the first assembly.

8. A system for stacking printed circuit boards comprising:
a solder paste printer configured to print a solder paste, the solder paste comprising a first solder paste and a second solder paste;
a pick and place machine configured to place components; and
a reflow soldering machine configured to perform reflow soldering;
wherein the solder paste printer is further configured to print the first solder paste on a lower baseboard, the pick and place machine is further configured to place a placement component and a pinboard on the lower baseboard, the reflow soldering machine is further configured to reflow solder the lower baseboard with the placement component and the pinboard, to connect the placement component and the pinboard to the lower baseboard through the first solder paste, and thereby forming a first assembly;
wherein the solder paste printer is further configured to print the second solder paste on a upper baseboard, the pick and place machine is further configured to place the placement component and the first assembly on the upper baseboard, the reflow soldering machine is further configured to reflow solder the upper baseboard with the placement component and the first assembly, to connect the placement component to the upper baseboard through the first solder paste, and to connect the first assembly to the upper baseboard through the second solder paste, and thereby forming a printed circuit board; and
wherein a melting point of the first solder paste is higher than a melting point of the second solder paste.

9. The system according to claim 8, wherein the upper baseboard comprises an upper first surface and an upper second surface opposite to the upper first surface; and the solder paste printer is further configured to print the first solder paste on the upper second surface and print the first solder paste on the upper first surface.

10. The system according to claim 9, wherein the solder paste printer is further configured to print the first solder paste on the upper second surface and print the first solder paste on the upper first surface.

11. The system according to claim 10, wherein the solder paste printer is further configured to arrange a first frame on the upper first surface and print the first solder paste on the upper first surface;
the solder paste printer is further configured to arrange a second frame on the upper first surface and print the second solder paste on the upper first surface; and
wherein the second frame is a stepped-shaped steel frame and configured to shelter the first solder paste.

12. The system according to claim 11, wherein the second frame comprises a print portion and a shelter portion, the print portion and the shelter portion form a stepped-shape, and the shelter portion is configured to shelter the printed first solder paste when printing the second solder paste.

13. The system according to claim 12, the shelter portion comprises a supporter configured to resist against the upper baseboard.

14. The system according to claim 8, further comprising a solder paste detector configured to detect whether any defect exists of the printing of the solder paste, wherein the solder paste comprises the first solder paste and the second solder paste.

15. The system according to claim 14, further comprising a first optical appearance detector configured to detect the placing positions of the placement component, the pinboard, and the first assembly.

16. The system according to claim 15, further comprising a second optical appearance detector configured to detect whether any defect exists of the soldering of the placement component, the pinboard, and the first assembly.

* * * * *